United States Patent
Uemura et al.

(10) Patent No.: US 6,936,859 B1
(45) Date of Patent: Aug. 30, 2005

(54) LIGHT-EMITTING SEMICONDUCTOR DEVICE USING GROUP III NITRIDE COMPOUND

(75) Inventors: Toshiya Uemura, Aichi-ken (JP); Shigemi Horiuchi, Aichi-ken (JP)

(73) Assignee: Toyoda Gosei Co., Ltd., Aichi-ken (JP)

(*) Notice: Subject to any disclaimer, the term of this patent is extended or adjusted under 35 U.S.C. 154(b) by 0 days.

(21) Appl. No.: 09/559,273

(22) Filed: Apr. 27, 2000

Related U.S. Application Data

(63) Continuation of application No. 09/310,974, filed on May 13, 1999, now abandoned.

(30) Foreign Application Priority Data

| May 13, 1998 | (JP) | ............................................ 10-150532 |
| Dec. 17, 1998 | (JP) | ............................................ 10-358549 |
| Mar. 4, 1999 | (JP) | ............................................ 11-056357 |

(51) Int. Cl.⁷ ..................... H01L 27/15; H01L 33/00; H01L 29/12
(52) U.S. Cl. ..................... 257/99; 257/79; 257/778; 257/103; 257/613; 257/615
(58) Field of Search .................... 257/99, 778, 103, 257/613, 615, 79, 11, 21, 22, 200, 201, 431, 453, 745, 743, 748, 758

(56) References Cited

U.S. PATENT DOCUMENTS

| 4,268,849 A | * | 5/1981 | Gray et al. ................... 357/71 |
| 5,216,491 A | | 6/1993 | Yamamoto et al. |
| 5,408,120 A | | 4/1995 | Manabe et al. |
| 5,412,249 A | * | 5/1995 | Hyugaji et al. ............. 257/745 |
| 5,523,623 A | * | 6/1996 | Yanagihara et al. ......... 257/745 |
| 5,563,422 A | | 10/1996 | Nakamura et al. |
| 5,614,736 A | * | 3/1997 | Neumann et al. ........... 257/102 |
| 5,990,500 A | | 11/1999 | Okazaki |

(Continued)

FOREIGN PATENT DOCUMENTS

| EP | 0 051 172 A1 | * | 5/1982 |
| EP | 0 622 858 A2 | | 11/1994 |

(Continued)

OTHER PUBLICATIONS

Japense Office Action dated May 18, 2004, with partial English translation.

(Continued)

*Primary Examiner*—Jerome Jackson
*Assistant Examiner*—Joseph Nguyen
(74) *Attorney, Agent, or Firm*—McGinn & Gibb, PLLC

(57) ABSTRACT

A flip chip type of light-emitting semiconductor device using group III nitride compound comprising a thick positive electrode. The positive electrode, which is made of at least one of silver (Ag), rhodium (Rh), ruthenium (Ru), platinum (Pt) and palladium (Pd), and an alloy including at least one of these metals, is adjacent to a p-type semiconductor layer, and reflect light toward a sapphire substrate. Accordingly, a positive electrode having a high reflectivity and a low contact resistance can be obtained. A first thin-film metal layer, which is made of cobalt (Co) and nickel (Ni), or any combinations of including at least one of these metals, formed between the p-type semiconductor layer and the thick electrode, can improve an adhesion between a contact layer and the thick positive electrode. A thickness of the first thin-film metal electrode should be preferably in the range of 2 Å to 200 Å, more preferably 5 Å to 50 Å. A second thin-film metal layer made of gold (Au) can further improve the adhesion.

17 Claims, 10 Drawing Sheets

U.S. PATENT DOCUMENTS

| | | | |
|---|---|---|---|
| 6,008,539 A | * 12/1999 | Shibata et al. | 257/745 |
| 6,169,297 B1 | * 1/2001 | Jang et al. | 257/99 |
| 6,185,238 B1 | * 2/2001 | Onomura et al. | 372/46 |
| 6,194,743 B1 | 2/2001 | Kondoh et al. | |
| 6,258,618 B1 | 7/2001 | Lester | |
| 6,268,618 B1 | * 7/2001 | Miki et al. | 257/99 |
| 6,281,526 B1 | * 8/2001 | Nitta et al. | 257/103 |

FOREIGN PATENT DOCUMENTS

| | | |
|---|---|---|
| EP | 0 825 652 A2 | 2/1998 |
| JP | 4-63480 | 2/1992 |
| JP | 05-211347 | 8/1993 |
| JP | 05-291621 | 11/1993 |
| JP | 06-314822 | 11/1994 |
| JP | 7-161712 | 6/1995 |
| JP | 07-288340 | 10/1995 |
| JP | 08-064872 | 3/1996 |
| JP | 9-8403 | 1/1997 |
| JP | 9-64421 | 3/1997 |
| JP | 9-232632 | 9/1997 |
| JP | 09-293898 A | 11/1997 |
| JP | 10-012921 | 1/1998 |
| JP | 0 051 172 A1 | 5/1998 |
| JP | 10-135519 | 5/1998 |
| JP | 10-190066 | 7/1998 |
| JP | 10-209494 | 8/1998 |
| JP | 10-233395 | 9/1998 |
| JP | 10-270755 A | 10/1998 |
| JP | 11-186598 | 7/1999 |
| JP | 11-191641 | 7/1999 |
| JP | 11-220168 | 8/1999 |
| JP | 2000-174341 | 6/2000 |

OTHER PUBLICATIONS

Partial Translation of Japanese patent application Laid–open No. H9–232632.

Kondoh et al., "Flip–chip GaN LED with Highly Reflective Ag P–contact" Integrated Photonics Research Postconference Edition, Mar. 30–Apr. 1, 1998, ITuF2–1/253–ITuF2–3/255.

Japanese Office Action dated Dec. 24, 2003 with partial translation.

German Office Action dated May 3, 2000 and English translation.

* cited by examiner

REFLECTED LIGHT

FIG. 3

| ITEM | TECHNOLOGY DIVISION | STRUCTURE | POSITIVE ELECTRODE | FIRST THIN-FILM METAL LAYER | SECOND THIN-FILM METAL LAYER | RELATIVE LUMINOUS INTENSITY | ADHESIVENESS |
|---|---|---|---|---|---|---|---|
| 1 | PRIOR ART | LIGHT-EMITTING DEVICE 400 | Co (3000 Å) | – | – | 100 | ◎ |
| 2 | PRESENT INVENTION | LIGHT-EMITTING DEVICE 150 | Ni (3000 Å) | – | – | 100 | ◎ |
| 3 | PRESENT INVENTION | LIGHT-EMITTING DEVICE 150 | Ag (3000 Å) | – | – | 160 | O⁻ |
| 3.1 | PRESENT INVENTION | LIGHT-EMITTING DEVICE 150 | Rh (3000 Å) | – | – | 140 | ◎ |
| 4 | PRESENT INVENTION | LIGHT-EMITTING DEVICE 100 | Ag (3000 Å) | Co (10 Å) | – | 150 | O |
| 5 | PRESENT INVENTION | LIGHT-EMITTING DEVICE 100 | Rh (3000 Å) | Co (10 Å) | – | 130 | O |
| 6 | PRESENT INVENTION | LIGHT-EMITTING DEVICE 100 | Pt (3000 Å) | Co (10 Å) | – | 110 | O |
| 7 | PRESENT INVENTION | LIGHT-EMITTING DEVICE 100 | Pd (3000 Å) | Co (10 Å) | – | 110 | O |
| 8 | PRESENT INVENTION | LIGHT-EMITTING DEVICE 200 | Ag (3000 Å) | Co (10 Å) | Au (150 Å) | 150 | ◎ |

◎ : EXCELLENT   O : GOOD   O⁻ : inferior than GOOD but usable

REFLECTED LIGHT

FIG. 5A

| PRIOR ART | | 100 |
|---|---|---|
| PRESENT INVENTION | Pt | 130 |
| | Rh | 140 |

FIG. 5B

| | INITIAL LUMINOUS INTENSITY | 100 h LATER | 1000 h LATER |
|---|---|---|---|
| PRIOR ART | 100 | 90 | 85 |
| PRESENT INVENTION | 100 | 95 | 90 |

FIG. 6

| METAL | ① | ② | ③ | ④ | ⑤ | ⑥ |
|---|---|---|---|---|---|---|
| Rh | ◎ | O⁺ | O⁺ | O⁺ | O | ◎ |
| Pt | O | O | O | O | △ | O |
| Ru | O | O | O | O | △ | O |
| Ag | ◎ | O | △ | △ | △ | O⁻ |
| Pd | O | O | △ | O | △ | O⁻ |
| Al | ◎ | △ | O | O | X | △ |
| Ni | △ | O | O | O | O | △ |
| Co | △ | O | O | X | O | △ |
| Mg | O | △ | X | △ | △ | △⁻ |
| Sn | O | X | X | X | UNIDENTIFIED | X |

◎ :EXELLENT   O :GOOD   △ :MEDIOCLE   X :BAD   O⁺ :better than O   O⁻ :worse than O

REFLECTED LIGHT

LIGHT-EMITTING SEMICONDUCTOR DEVICE USING GROUP III NITRIDE COMPOUND

The application is a continuation of U.S. Ser. No. 09/310,974 filed May 13, 1999, now abandoned.

BACKGROUND OF THE INVENTION

1. Field of the Invention

The present invention relates to a flip chip type of light-emitting semiconductor device that comprises layers using group III nitride formed on a sapphire substrate. Especially, the present invention relates to the device having a high luminous intensity and a low driving voltage.

2. Description of the Related Art

FIG. 7 shows a sectional view of a conventional flip chip type of light-emitting semiconductor 400. Each 101, 102, 103, 104, 105, 106, 120, 130, and 140 represents a sapphire substrate, a buffer layer of AlN or GaN, an n-type GaN layer, an emission layer, a p-type AlGaN layer, a p-type GaN layer, a positive electrode, a protective film, a negative electrode having a multi-layer structure, respectively. And the thick positive electrode 120 which is connected to the layer 106 is a metal layer having a thickness of 3000 Å and being formed by metals such as nickel (Ni) or cobalt (Co).

Conventionally, to reflect light emitted from an emission layer 104 toward a sapphire substrate 101 effectively, a thick metal electrode is used as a flip tip type positive electrode 120.

However, a problem persists in luminous intensity. In the conventional device, metals such as nickel (Ni) or cobalt (Co) has been used to form the thick positive electrode 120. As a result, a reflectivity of visible (violet, blue, and green) rays whose wavelength is in the range of 380 nm to 550 nm was insufficient, and the device could not obtain an adequate luminous intensity as a light-emitting semiconductor device. Therefore, further improvement has been required, as presently appreciated by the present inventors.

SUMMARY OF THE INVENTION

An object of the present invention is to obtain a light-emitting semiconductor device having a high luminous intensity and a low driving voltage.

Another object of the present invention is to obtain a light-emitting semiconductor device whose electrode has a high reflectivity and a high durability and in which the structure of electrodes is simplified.

To achieve the above objects, a first aspect of the present invention is a flip chip type of light-emitting semiconductor device using group III nitride compound semiconductor constituted by group III nitride compound semiconductor layers which is formed on a substrate and a positive electrode including at least one layer of a first positive electrode layer which is contacted to a p-type semiconductor layer and reflects light toward the substrate. The positive electrode is made of at least one of silver (Ag), rhodium (Rh), ruthenium (Ru), platinum (Pt), palladium (Pd), and an alloy including at least one of these metals. The thickness of the positive electrode should be preferably in the range of 100 Å to 5 μm.

The second aspect of the present invention is to form a multi-layer structure made of a plural kinds of metals in the electrode described above. When the first positive electrode layer formed on or above i.e., comparatively close to the p-type semiconductor layer is made of silver (Ag), rhodium (Rh), ruthenium (Ru), platinum (Pt), palladium (Pd), and an alloy including at least one of these metals, the effect of the present invention is realized. Almost all the lower layers including the first positive electrode layer, which are placed in the range of 1000 Å below the positive electrode, should be further preferably made of metals described above.

The third aspect of the present invention is to form a first thin-film metal layer made of at least one of cobalt (Co), nickel (Ni), and an alloy including at least one of these metals between the p-type semiconductor layer and the first positive electrode layer.

The fourth aspect of the present invention is to define a thickness of the first thin-film metal layer in the range of 2 Å to 200 Å. The thickness of the first thin-film metal layer should be preferably in the range of 5 Å to 50 Å.

The fifth aspect of the present invention is to form a second thin-film metal layer made of at least one of gold (Au) and an alloy including gold (Au) between the first thin-film metal layer and the first positive electrode layer.

The sixth aspect of the present invention is to define a thickness of the second thin-film metal layer in the range of 10 Å to 500 Å. The thickness of the second thin-film metal layer should be preferably in the range of 30 Å to 300 Å.

The seventh aspect of the present invention is to define a thickness of the first positive electrode layer in the range of 0.01 μm to 5 μm. The thickness of the first positive electrode layer should be preferably in the range of 0.05 μm to 1 μm.

The eighth aspect of the present invention is to form a second positive electrode layer made of one of gold (Au) and an alloy including gold (Au) on the first positive electrode layer.

The ninth aspect of the present invention is to define a thickness of the second positive electrode layer in the range of 0.03 μm to 5 μm. The thickness of the second positive electrode layer should be preferably in the range of 0.05 μm to 3 μm, and more preferably 0.5 μm to 2 μm.

The tenth aspect of the present invention is to form a third positive electrode layer made of at least one of titanium (Ti), chromium (Cr), and an alloy including at least one of these metals the first positive electrode layer or the second positive electrode layer.

The eleventh aspect of the present invention is to define a thickness of the third positive electrode metal layer in the range of 3 Å to 1000 Å. The thickness of the third positive electrode layer should be preferably in the range of 3 Å to 1000 Å, 10 Å to 500 Å, and more preferably, 15 Å to 100 Å, 5 Å to 500 Å.

The twelfth aspect of the present invention is to form the first positive electrode layer made of at least one of rhodium (Rh), ruthenium (Ru), and an alloy including at least one of these metalson the p-type semiconductor layer.

The thirteenth aspect of the present invention is the positive electrode having a multi-layer structure comprising following three layers: the first positive electrode layer made of at least one of rhodium (Rh), ruthenium (Ru), and an alloy including at least one of these metals; the second positive electrode layer made of one of gold (Au) and an alloy including gold (Au), formed directly on the first positive electrode layer; and the third positive electrode layer made of at least one of titanium (Ti), chromium (cr), and an alloy including at least one of these metals, formed directly on the second positive electrode layer. The first positive electrode layer is directly connected to the p-type semiconductor layer.

The fourteenth aspect of the present invention is to define thicknesses of the first, the second, and the third positive electrode layers in the range of 0.02 μm to 2 μm, 0.05 μm to 3 μm, and 5 Å to 500 Å, respectively.

The fifteenth aspect of the present invention is a flip chip type of light-emitting semiconductor device using group III nitride compound semiconductor constituted by group III nitride compound semiconductor layers which is formed on a substrate and a positive electrode including at least one layer of a first positive electrode layer which is formed on or above a p-type semiconductor layer and reflects light toward the substrate. The positive electrode has a three-layer structure constituted by a first positive electrode layer which is made of at least one of rhodium (Rh), ruthenium (Ru), and an alloy including at least one of these metals, a second positive electrode layer which is made of titanium (Ti), chromium (Cr), and an alloy including at least one of these metals, and formed directly on the first positive electrode layer, and a third positive electrode layer which is made of gold (Au) and an alloy including gold (Au), formed directly on the second electrode layer.

The sixteenth aspect of the present invention is to form a fourth positive electrode layer which is made of at least one of titanium (Ti), chromium (Cr), and an alloy including at least one of these metals, and formed directly on the third positive electrode layer.

The seventeenth aspect of the present invention is to form an insulated protective film made of at least one of silicon oxide ($SiO_2$), silicon nitride ($Si_xN_y$), titanium compound ($Ti_xN_y$, etc.), and polyamide directly on the third and the fourth positive electrode layers.

Because each of silver (Ag), rhodium (Rh), ruthenium (Ru), platinum (Pt), and palladium (Pd) has a large reflectivity R ($0.6<R<1.0$) with respect to visible (violet, blue, and green) rays whose wavelength is in the range of 380 nm to 550 nm, using one of these metals or an alloy including at least one of them to form the first positive electrode layer improves a reflectivity of the positive electrode. Accordingly, the device of the present invention can obtain a sufficient luminous intensity as a light-emitting semiconductor device.

FIG. 6 illustrates a table showing characteristics of metals used in the first positive electrode layer. Details of the list are explained in the following embodiments. Judging from a various evaluations shown in FIG. 6, the five kinds of metals, i.e., rhodium (Rh), platinum (Pt), ruthenium (Ru), silver (Ag), and palladium (Pd), are proved to be best ones to form the first positive electrode layer.

Because those five metals have a large work function, a contact resistance between the p-type semiconductor layer and silver (Ag), rhodium (Rh), ruthenium (Ru), platinum (Pt), palladium (Pd), and an alloy including at least one of these metals is small. That is, a light-emitting semiconductor device having a low driving voltage can be provided by using these metals.

And because these metals are precious metal or platinum group metal, a age deterioration for corrosion resistance against moisture, for example, is improved and an electrode of high quality can be provided by using these metals.

Although rhodium (Rh) is inferior a little to silver (Ag) concerning reflectivity, it has the same or superior characteristics compared with other metals for other characteristics. So rhodium (Rh) is proved to be one of the best metals to form the first positive electrode layer.

Also, ruthenium (Ru) has a similar or close characteristics to rhodium (Rh). So it is also proved to be one of the best metals to form the first positive electrode layer.

By forming the first thin-film metal layer, an adhesion between the the first positive electrode layer and the p-type semiconductor layer is improved, and a light-emitting semiconductor device having a more durable structure can be provided. A thickness of the first thin-film metal layer should be preferably in the range of 2 Å to 200 Å. When the thickness of the first thin-film metal layer is less than 2 Å, a firm adhesion cannot be obtained, and when more than 200 Å, a light reflectivity of silver (Ag), rhodium (Rh), ruthenium (Ru), platinum (Pt), palladium (Pd), and an alloy including at least one of these metals, which form the thick first positive electrode layer, becomes insufficient.

Further, by forming the second thin-film metal layer, an adhesion between the first positive electrode layer and the p-type semiconductor layer is improved, and a light-emitting semiconductor device having a more further durable structure can be provided. A thickness of the second thin-film metal layer should be preferably in the range of 10 Å to 500 Å. When the thickness of the second thin-film metal layer is less than 10 Å, a firm adhesion cannot be obtained, and when more than 500 Å, a light reflectivity of silver (Ag), rhodium (Rh), ruthenium (Ru), platinum (Pt), palladium (Pd), and an alloy including at least one of these metals, which form the first positive electrode layer, becomes insufficient.

A thickness of the first positive electrode layer is in the range of 0.01 μm and 5 μm. When the thickness of the first positive electrode layer is less than 0.01 μm, an emitted light transmits through the larger without reflection and when more than 5 μm, too much time is required to form, which is not preferable for a mass production.

By forming the second positive electrode layer, the positive electrode can be provided without increasing a resistance of the thick positive electrode. To prevent an adverse effect caused by heating and cooling while forming a bump material, a gold ball, or a wire bonding, the thickness of the positive electrode should be preferably more than 0.1 μm. Because gold (Au) is a material which is easy to be formed and has a superior corrosion resistance, and because it has strong adhesion to a bump material, a gold ball, or a wire bonding, it is preferable to use gold (Au) or an alloy including gold (Au) to form the second positive electrode layer.

A thickness of the second positive electrode layer should be preferably in the range of 0.03 μm to 5 μm. When the thickness of the second positive electrode layer is less than 0.03 μm, a sufficient effect cannot be obtained, and when more than 5 μm, too much time is required to form the electrodes.

And when the thickness of the second positive electrode layer is more than 5 μm, a thickness of a negative electrode become unnecessarily thicker in order to form a bump or a gold ball, as explained in the following third embodiment, which is not preferable.

By forming the third positive electrode layer (the fourth positive electrode layer in case of the sixteenth aspect) made of at least one of titanium (Ti), chromium (Cr), and an alloy including at least one of these metals, when an insulation layer made of, for example, silicon oxide (SiO2), silicon nitride ($Si_xN_y$), or polyamide, between the positive and negative electrodes, which are formed on the opposite sides of the substrate, the insulation layer can be prevented from peeling off from the positive electrodes. Accordingly, the third positive electrode layer can prevent a bump material from short-circuiting while forming a bump. A thickness of the third positive electrode layer should be preferably in the range of 3 Å to 1000 Å. When the thickness of the third positive electrode layer is less than 3 Å, a firm adhesion to the insulation layer cannot be obtained, and when more than 1000 Å, a firm adhesion to connecting materials such as a bump material or a gold ball cannot be obtained, which are not preferable.

Because the positive electrode having a multi-layer structure as described above has a high reflectivity and a large durability against moisture, a protection layer can be partly simplified. As a result, the positive electrode can be connected to an external electrode without using a wire bonding.

The flip chip type of light-emitting semiconductor device shown in the fifteenth aspect of the present invention differs from that of the thirteenth and the fourteenth aspect of the present invention in the constituent elements of the second and the third positive electrode layers. The semiconductor device shown in the fifteenth aspect can provide the same effect as that shown in the thirteenth and the fourteenth aspect of the present invention.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIG. 3 is a table to compare performances of each flip tip type of light-emitting semiconductor devices 100, 200 and 400 in accordance with the second embodiment of the present invention;

FIG. 5A is a table comparing luminous intensities of the light-emitting semiconductor device 300 explained above and the light-emitting semiconductor device 400 of prior art in accordance with the third embodiment of the present invention;

FIG. 5B is a table comparing the aging variations for luminous intensities of the light-emitting semiconductor device 500 and the light-emitting semiconductor device 400 of the prior art.

FIG. 6 is a table showing characteristics of metals used in the first positive electrode layer in accordance with the third embodiment of the present invention;

DETAILED DESCRIPTION OF THE PREFERRED EMBODIMENTS

The present invention will be described hereinbelow with reference to specific embodiments.

(First Embodiment)

Figure 1:
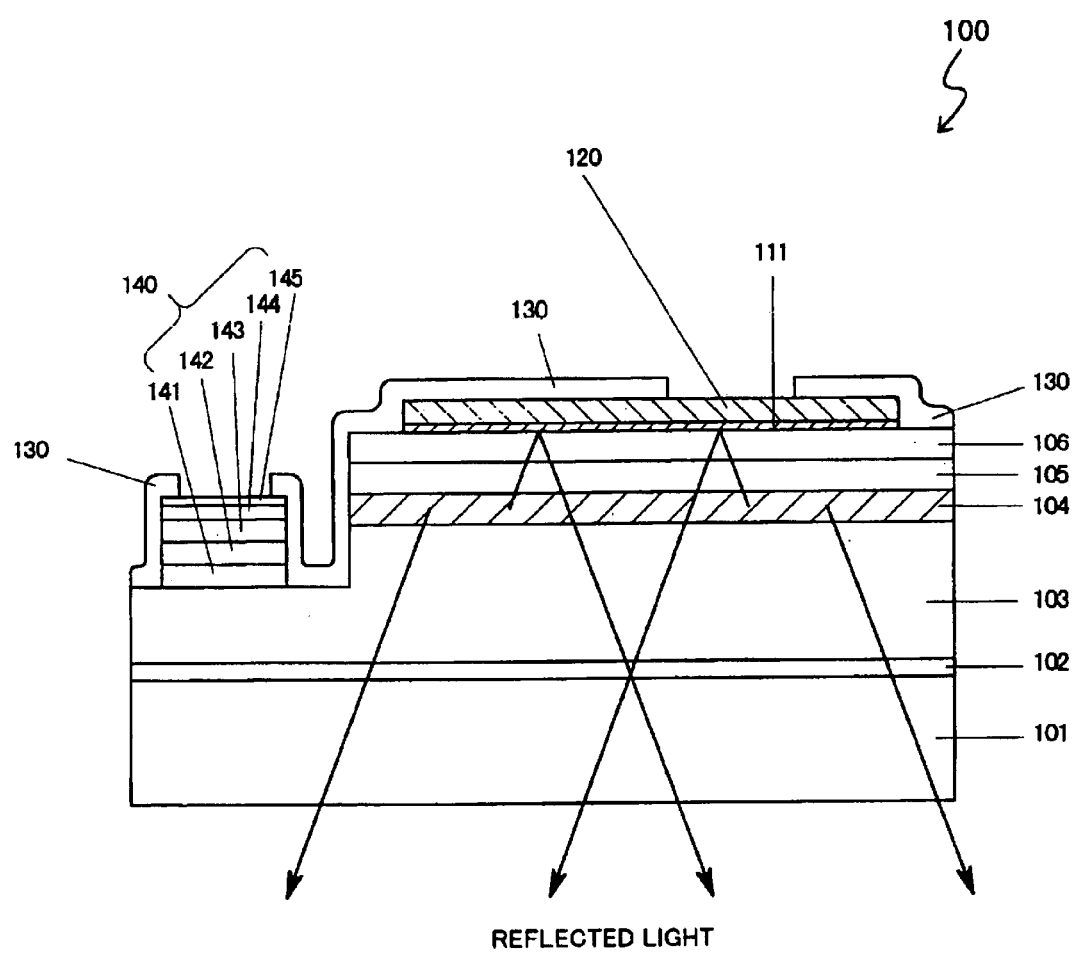
FIG. 1 is a sectional view of a flip tip type of light-emitting semiconductor device 100 in accordance with the first embodiment of the present invention.

FIG. 1 illustrates a sectional view of a flip tip type of light-emitting semiconductor device 100. The semiconductor device 100 has a sapphire substrate 101 which has a buffer layer 102 made of nitride aluminum (AlN) having a thickness of 200 Å and an $n^+$-layer 103 having a thickness of 4.0 μm with a high carrier concentration successively thereon.

And an emission layer 104 constructed with a multi quantum-well (MQW) structure made of GaN and $Ga_{0.8}In_{0.2}N$ is formed on the $n^+$-layer 103. A Mg-doped p-layer 105 made of $Al_{0.15}Ga_{0.85}N$ having a thickness of 600 Å is formed on the emission layer 104. Further, a Mg-doped p-layer 106 made of GaN having a thickness of 1500 Å is formed on the p-layer 105.

A first thin-film metal layer 111 is formed by a metal deposit on the p-layer 106 and a negative electrode 140 is formed on the $n^+$-layer 103. The first thin-film metal layer 111 is made at least one of of cobalt (Co) and nickel (Ni) having a thickness about 10 Å, and is adjacent to the p-layer 106. A positive electrode (first positive electrode layer) 120 is made of at least one of silver (Ag), rhodium (Rh), ruthenium (Ru), platinum (Pt), palladium (Pd), and an alloy including at least one of them, having a thickness of about 3000 Å.

The negative electrode 140 having a multi-layer structure is formed on an exposed portion of the $n^+$-layer 103 of high carrier concentration. The multi-layer structure is comprising following five layers: about a 175 Å in thickness of vanadium (V) layer 141; about 1000 Å in thickness of aluminum (Al) layer 142; about 500 Å in thickness of vanadium (V) layer 143; about 5000 Å in thickness of nickel (Ni) layer 144; and about 8000 Å in thickness of gold (Au) layer 145. A protective film 130 made of $SiO_2$ is formed on the top surface.

As described above, when the positive electrode 120 is made of at least one of silver (Ag), rhodium (Rh), ruthenium (Ru), platinum (Pt), palladium (Pd), and an alloy including at least one of these metals, a luminous intensity is improved by about 10% to 50% compared with a light-emitting semiconductor device 400 of prior arts which is shown in item number 1 and 2 of FIG. 3.

(Second Embodiment)

Figure 2:
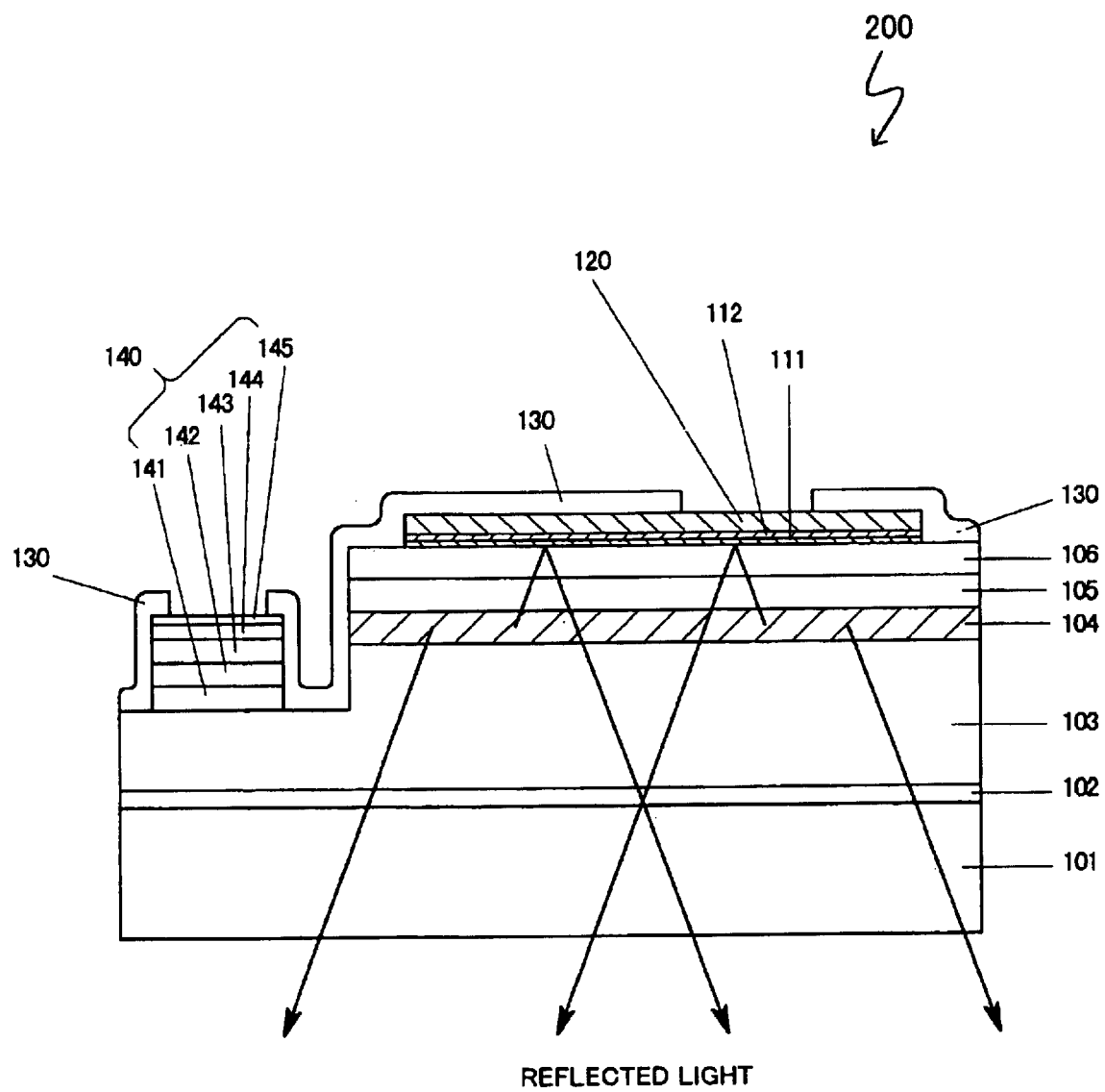
FIG. 2 is a sectional view of a flip tip type of a light-emitting semiconductor device 200 in accordance with the second embodiment of the present invention.

FIG. 2 shows a sectional view of a flips chip type of light-emitting semiconductor device 200 of the present invention. The semiconductor device 200 differs from the device 100 described in the first embodiment only in forming a second thin-film metal layer 112 on the first thin-film metal layer 111. The second thin-film metal layer 112 is made of Au having a thickness of about 150 Å, which is formed by a metal deposit after the first-thin film metal layer 111 is formed, in the same way of forming the first thin-film metal layer 111 made of cobalt (Co) or nickel (Ni) having a thickness of about 10 Å.

Forming this second thin-film metal layer 112 between the first thin-film metal layer 111 and the positive electrode (first positive electrode layer) 120 enables the positive electrode 120 to be connected to the layer 106 more firmly.

FIG. 3 shows a table to compare performances of each flip tip type of light-emitting semiconductor devices 100, 150, 200 and 400, respectively. The table of FIG. 3 also shows performances of a flip chip type of light-emitting semiconductor device, comprising a positive electrode 120 which is made of at least one of silver (Ag) and rhodium (Rh), directly contacted to the p-layer 106 without the first thin-film layer 111 in the first embodiment, shown in FIG. 8 (item number 3, or 3.1).

As shown in this table, a luminous intensity of the light-emitting semiconductor device 100 or 200 in the present invention, which has the positive electrode 120 made of metal layers comprising at least one of silver (Ag), rhodium (Rh), ruthenium (Ru), platinum (Pt), palladium (Pd), and an alloy including at least one of these metals, is improved by about 10% to 50% compared with the light-emitting semiconductor device 400 of prior arts which is shown in item number 1 and 2 of FIG. 3.

Further, with respect to the light-emitting semiconductor device 400 shown in item numbers 1 and 2, a first thin-film metal layer is not formed because the positive electrode 120 itself is made of cobalt (Co) or nickel (Ni), which ensures an adhesion between the positive electrode 120 and the layer 106 sufficiently. The light-emitting semiconductor device 400 shown in item number 1 and 2 of FIG. 3, which contains the positive electrode 120 made of cobalt (Co) or nickel (Ni), has a low relative luminous intensity because a reflectivity of metal elements which constitute the positive electrode 120 is small. Accordingly, superiority or inferiority of the relative luminous intensities shown in FIG. 3 is not due to the existence of the first thin-film metal layer 111.

Conversely, when the positive electrode 120 is made of at least one of silver (Ag), rhodium (Rh), ruthenium (Ru), platinum (Pt), palladium (Pd), and an alloy including at least one of these metals, a large luminous intensity can be obtained in case that the first or the second thin-film metal layer 111 or 112 is not existed, as understood comparing item number 3 with item numbers 4 and 8 of FIG. 3. The luminous intensity shows an excellent value although a adhesion between the positive electrode 120 and the layer 106 is inferior to some degree. That is because the first and the second thin-film metal layers 111 and 112 which absorb light do not exist.

Figure 8:
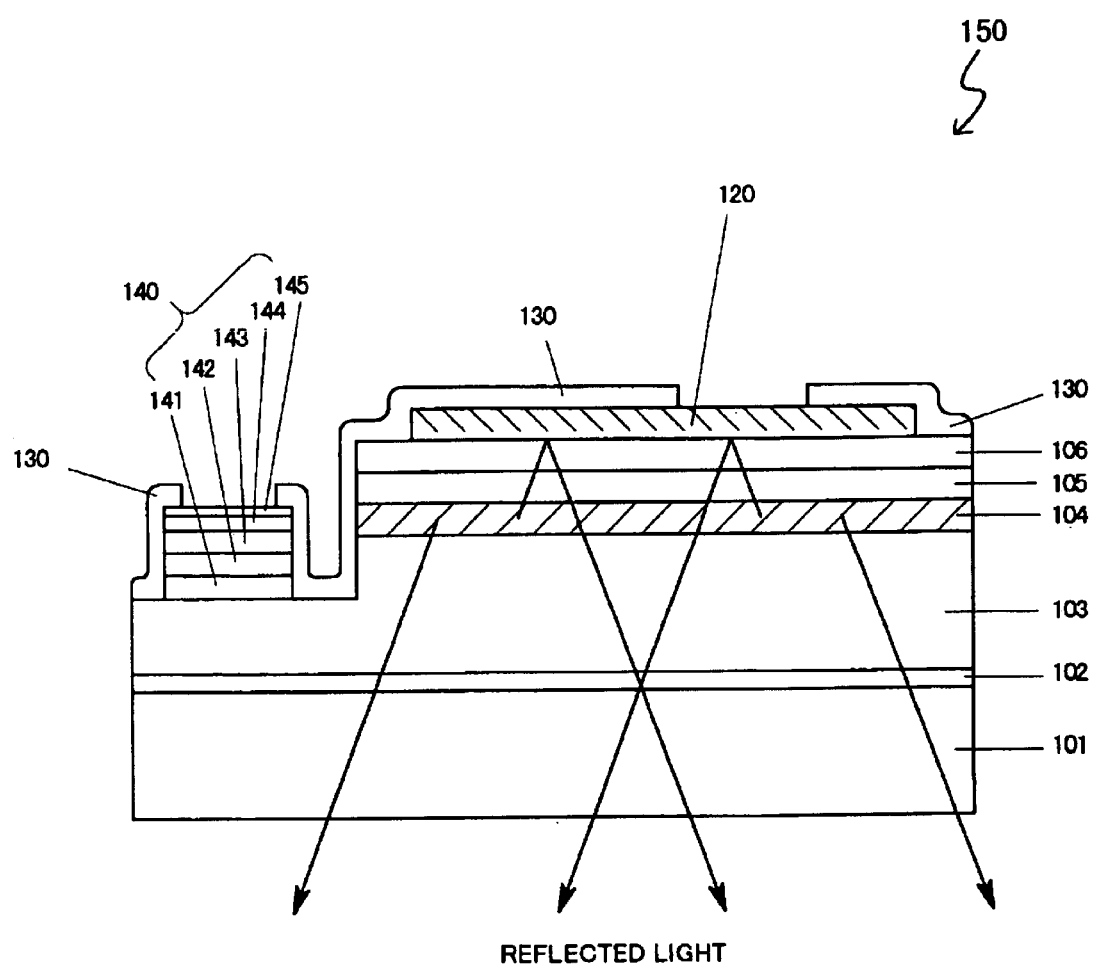
FIG. 8 is a sectional view of a light-emitting semiconductor device 150 of the present invention.

Particularly, as shown in FIG. 8, when about 3000 Å in thickness of the positive layer 120 made of rhodium (Rh) is formed directly on a p-type GaN layer 106 in the light-emitting semiconductor device 150 without forming the first or the second thin-film metal layer, whose characteristics are shown in item number 3.1 of FIG. 3, the light-emitting semiconductor device 150 can have about the same luminous intensity as that of the light-emitting semiconductor device 200 shown in item 8. And also, an even or a firmer adhesion to the GaN layer 106 can be obtained. These are caused by a high reflectivity of rhodium (Rh) and a firm adhesion of rhodium (Rh) to the GaN layer 106 in the light-emitting semiconductor device 150. Accordingly, the light-emitting semiconductor device 150 shown in item 3.1 superior to the light-emitting semiconductor device 100 shown in item 5 of FIG. 3 at these points.

In short, manufacturing the light-emitting semiconductor device 150 shown in item 3.1 of FIG. 3 means to be able to provide a light-emitting semiconductor device having sufficient conditions of a luminous intensity and a adhesion, because of a characteristic of rhodium (Rh), without forming the first or the second thin-film metal layer. Thus because the light-emitting semiconductor device 150 does not need a forming process of the first or the second thin-film metal layer, a sufficient mass productivity can be realized.

In the embodiment, the positive electrode 120 shown in FIGS. 1, 2 and 8 has a thickness about 3000 Å. Alternatively, the thickness of the electrode 120 can be in the range of 100 Å to 5 $\mu$m. When the thickness of the positive electrode 120 is less than 100 Å, a light reflectivity become insufficient. When the thickness is more than 5 $\mu$m, too much time and materials for deposit are required, which means that the thickness is of no use concerning a production cost performance.

In the embodiment, the first thin-film metal layer 111 has a thickness about 10 Å. Alternatively, the thickness of the first thin-film metal layer 111 can be in the range of 2 Å to 200 Å. The thickness of the first thin-film metal layer 111 should be more preferably in the range of 5 Å to 50 Å. When the thickness of the first thin-film metal layer 111 is too small, function of binding the positive electrode 120 to the GaN layer 106 is weakened, and when too large, a light absorption is occurred therein and a luminous intensity is lowered.

In the embodiment, the second thin-film metal layer 112 has a thickness about 150 Å. Alternatively, the thickness of the second thin-film metal layer 112 can be in the range of 10 Å to 500 Å. The thickness of the second thin-film metal layer 112 should be more preferably in the range of 30 Å to 300 Å. When the thickness of the second thin-film metal layer 112 is too small, binding the positive electrode 120 to the first thin-film metal layer 111 is weakened, and when too large, a light absorption is occurred therein and a luminous intensity is lowered.

In the embodiment, the positive electrode 120 has a single-layer structure. Alternatively, the positive electrode 120 can have a multi-layer structure. The positive electrode, 1.4 $\mu$m in thickness, can be formed by depositing, for example, about 5000 Å silver (Ag), about 800 Å nickel (Ni), and 8000 Å gold (Au), consecutively, on the GaN layer 106, the first thin-film metal layer 111, or the second thin-film metal layer 112. A light-emitting semiconductor device with sufficiently high reflectivity and luminous efficiency can be obtained by the positive electrode having this multi-layer structure.

(Third Embodiment)

Figure 4:
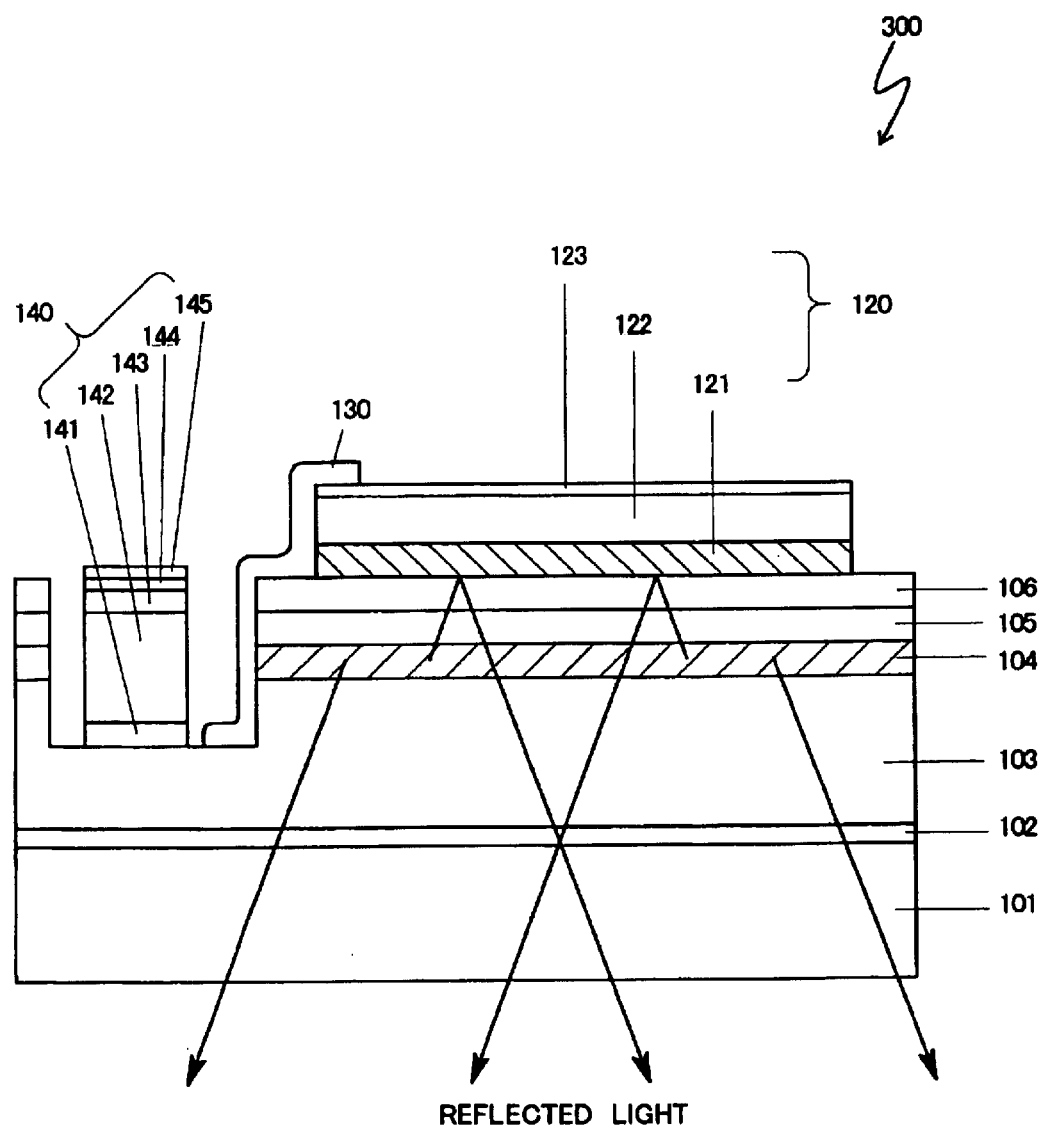
FIG. 4 is a sectional view of a flip tip type of light-emitting semiconductor device 300 in accordance with the third embodiment of the present invention.
Figure 7:
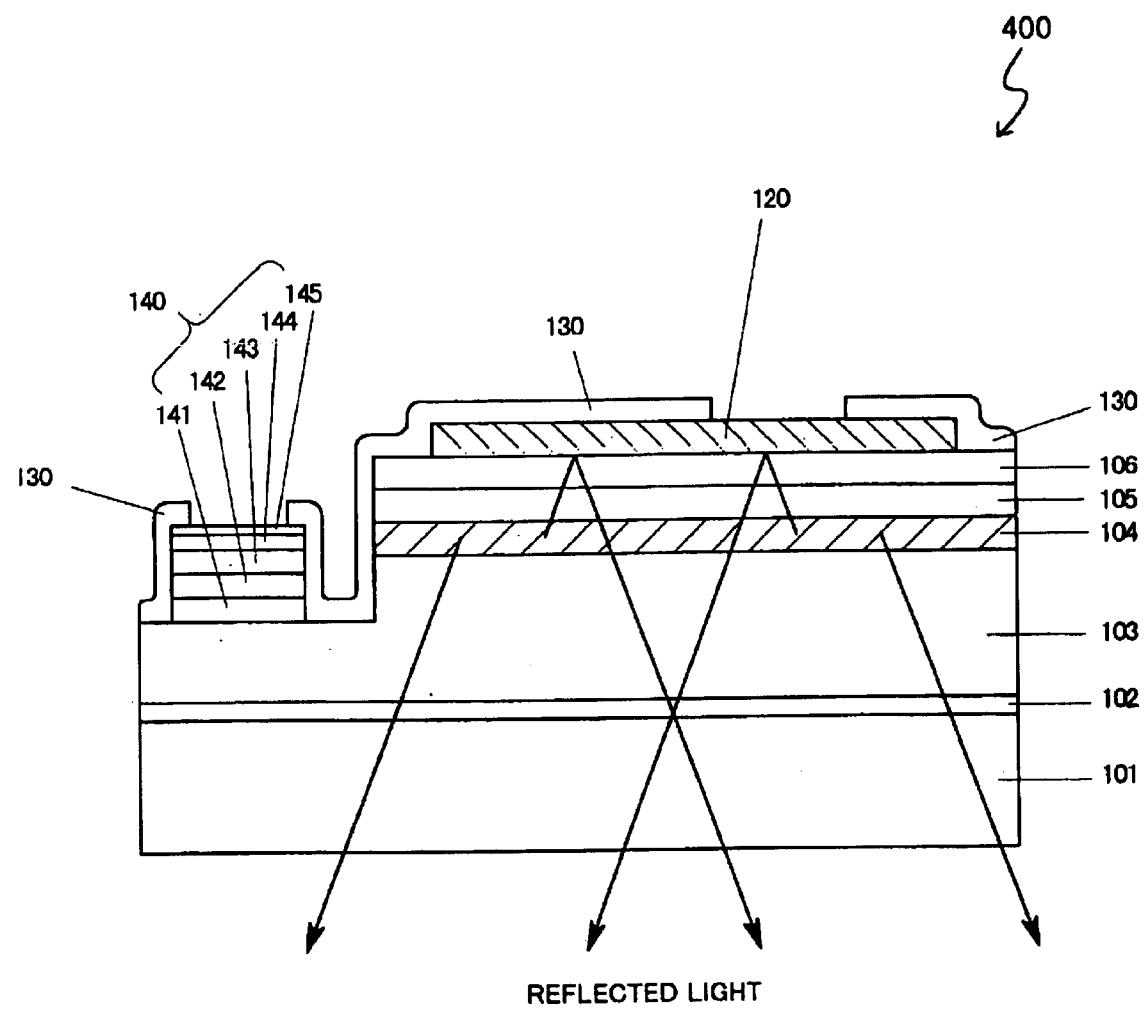
FIG. 7 is a sectional view of a light-emitting semiconductor device 400 of a prior art.

FIG. 4 illustrates a sectional view of a flip chip type of light-emitting semiconductor device 300. The semiconductor device 300 has a sapphire substrate 101 which has a buffer layer 102 made of nitride aluminum (AlN) having a thickness of 200 Å and an n$^+$-layer 103 having a thickness of 4.0 $\mu$m and a high carrier concentration successively thereon.

And an emission layer 104 having a multi quantum-well (MQW) structure made of GaN and $Ga_{0.8}In_{0.2}N$ is formed on the n$^+$-layer 103. A Mg-doped p-layer 105 made of $Al_{0.15}Ga_{0.85}N$ having a thickness of 600 Å is formed on the emission layer 104. Further, a Mg-doped p-layer 106 made of GaN having a thickness of 1500 Å is formed on the p-layer 105.

A positive electrode 120, which may be also referred to as a multiple positive electrode 120 hereinafter, is formed by a metal deposit on the p-layer 106 and a negative electrode 140 is formed on the n$^+$-layer 103. The multiple positive electrode 120 is made of a three-layer structure, having a first positive electrode layer 121 which is adjacent to the p-layer 106, a second positive electrode layer 122 formed on the first positive electrode layer 121, and a third positive electrode layer 123 formed on the second positive electrode layer 122.

The first positive electrode layer 121 is a metal layer adjacent to the p-layer 106, which is made of rhodium (Rh) and has a thickness about 0.1 $\mu$m. The second positive electrode layer 122 is a metal layer made of gold (Au), having a thickness about 1.2 $\mu$m. The third positive electrode layer 123 is a metal layer made of titanium (Ti), having a thickness about 20 Å.

A negative electrode 140 having a multi-layer structure is formed on an exposed portion of the n$^+$-layer 103 of high carrier concentration. The multi-layer structure is comprising following five layers: about 175 Å in thickness of vanadium (V) layer 141; about 1000 Å in thickness of aluminum (Al) layer 142; about 500 Å in thickness of vanadium (V) 143; about 5000 Å in thickness of nickel (Ni) layer 144; and about 8000 Å in thickness of gold (Au) layer 145.

A protection layer 130 made of $SiO_2$ film is formed between the multiple positive electrode 120 and the negative electrode 140. The protection layer 130 covers a portion of the $n^+$-layer 103 exposed to form the negative electrode 140, sides of the emission layer 104, the p-layer 105, and the p-layer 106 exposed by etching, a portion of an upper surface of the p-layer 106, sides of the first positive electrode layer 121, the second positive electrode layer 122, and the third positive electrode layer 123, and a portion of an upper surface of the third positive electrode layer 123. A thickness of the protection layer 130 covering a portion of the upper surface of the third positive electrode layer 123 is 0.5 $\mu$m.

FIG. 5A shows a table comparing luminous intensities of the light-emitting semiconductor device 300 explained above with the light-emitting semiconductor device 400 of prior art. As shown in FIG. 5A, the present invention can improve the luminous efficiency by about 30 to 40% compared with the prior art.

Because the structure of the flips chip type of light-emitting semiconductor device 300 allows itself to have a high luminous intensity and durability, the protection layer 130 can be omitted in considerable area and both the positive and the negative electrodes can use wider area to connect to an external electrode. By forming a bump by solder or a gold ball directly on the positive and the negative electrodes, the light-emitting semiconductor device 300 is inverted and can be directly connected with a circuit board.

Further, the light-emitting semiconductor device 300 can also be connected with an external electrode by a wire bonding.

In the third embodiment, the multiple positive electrode 120 has a thickness about 1.3 $\mu$m. Alternatively, the thickness of the multiple positive electrode 120 can be in the range of 0.11 $\mu$m to 10 $\mu$m. When the thickness of the multiple positive electrode 120 is less than 0.11 $\mu$m, a light reflectivity becomes insufficient, and a firm adhesion to connecting materials such as a bump, a gold ball, etc. cannot be obtained. And when the thickness of the multiple positive electrode 120 is more than 10 $\mu$m, too much time and materials for deposit are required, which means that the thickness is of no use concerning a production cost performance.

In the third embodiment, the first positive electrode layer 121 has a thickness about 0.1 $\mu$m. Alternatively, the thickness of the first positive electrode layer 121 can be in the range of 0.01 $\mu$m to 5 $\mu$m. The thickness of the first positive electrode layer 121 should be more preferably in the range of 0.05 $\mu$m to 1 $\mu$m. When the thickness of the first positive electrode layer 121 is too small, a light reflectivity becomes insufficient, and when too large, too much time and materials for deposit are required, which means that the thickness is of no use concerning a production cost performance.

In the third embodiment, the second positive electrode layer 122 has a thickness about 1.2 $\mu$m. Alternatively, the thickness of the second positive electrode layer 122 can be in the range of 0.03 $\mu$m to 5 $\mu$m. The thickness of the second positive electrode layer 122 should be preferably in the range of 0.1 $\mu$m to 5 $\mu$m, more preferably 0.2 $\mu$m to 3 $\mu$m, and further more preferably, 0.5 $\mu$m to 2 $\mu$m. When the thickness of the second positive electrode layer 122 is too small, a firm adhesion to connecting materials such as a bump, a gold ball, etc. cannot be obtained. And when too large, too much time and materials for deposit are required, which means that the thickness is not preferable for both the second positive electrode layer 122 and the negative electrode 140, concerning a production cost performance.

In the third embodiment, the third positive electrode layer 123 has a thickness about 20 Å. Alternatively, the thickness of the third positive electrode layer 123 can be in the range of 3 Å to 1000 Å. The thickness of the third positive electrode layer 123 should be preferably in the range of 5 Å to 1000 Å, more preferably 10 Å to 500 Å, and further more preferably, 15 Å to 100 Å. When the thickness of the third positive electrode layer 123 is too small, an adhesion to the protection layer 130 is weakened, and when too large, a resistivity becomes too large.

In the third embodiment, the third positive electrode layer 123 is made of titanium (Ti). Alternatively, the third positive electrode layer 123 can be made of titanium (Ti) or chromium (Cr), or an alloy including at least one of these metals.

FIG. 6 illustrates a table showing characteristics of metals used in the first positive electrode layer 121. Each evaluation items ① through ⑥ are as follows:

① REFLECTIVITY: a degree of reflectivity of visible (violet, blue, and green) rays whose wavelength is in the range of 380 nm to 550 nm, when a certain quantity of light is emitted by the emission layer 104;

② CONTACT RESISTANCE (DRIVING VOLTAGE): a degree of driving voltage of the light-emitting semiconductor device associated with a contact resistance to the GaN layer;

③ ADHESIVENESS TO GAN LAYER: a degree of generation frequency of a failure examined by a predetermined endurance test;

④ CORROSION RESISTSANCE: an evaluation by characteristics of each metal;

⑤ CHARACTERISTICS STABILITY AFTER FORMING Au: an evaluation by an increasing of driving voltage with laps of time after forming the second positive electrode layer 122 made of gold (Au) formed in the light-emitting semiconductor device 300, and a decreasing of reflectivity of visible rays;

⑥ TOTAL EVALUATION (MASS PRODUCTION): a total evaluation based on items ① to ⑤ described above, concerning a mass production of the light-emitting semiconductor device of this invention.

Especially, with respect to a flip chip type of light-emitting semiconductor device, the evaluations should be better than GOOD (○) at both items ① and ② for a mass production of the light-emitting semiconductor device. Accordingly, the list shown in FIG. 6 shows a usefulness of the present device.

Although rhodium (Rh) is inferior a little to silver (Ag) concerning reflectivity (item ①), it has the same or superior characteristics in items ② to ⑤, compared with other metals. So rhodium (Rh) is proved to be one of the best metals to form one of the positive electrode and the first positive electrode layer.

Also, ruthenium (Ru) has a similar or close characteristics to rhodium (Rh). So it is also proved to be one of the best metals to form one of the positive electrode and the first positive electrode layer.

(Fourth Embodiment)

Figure 9:
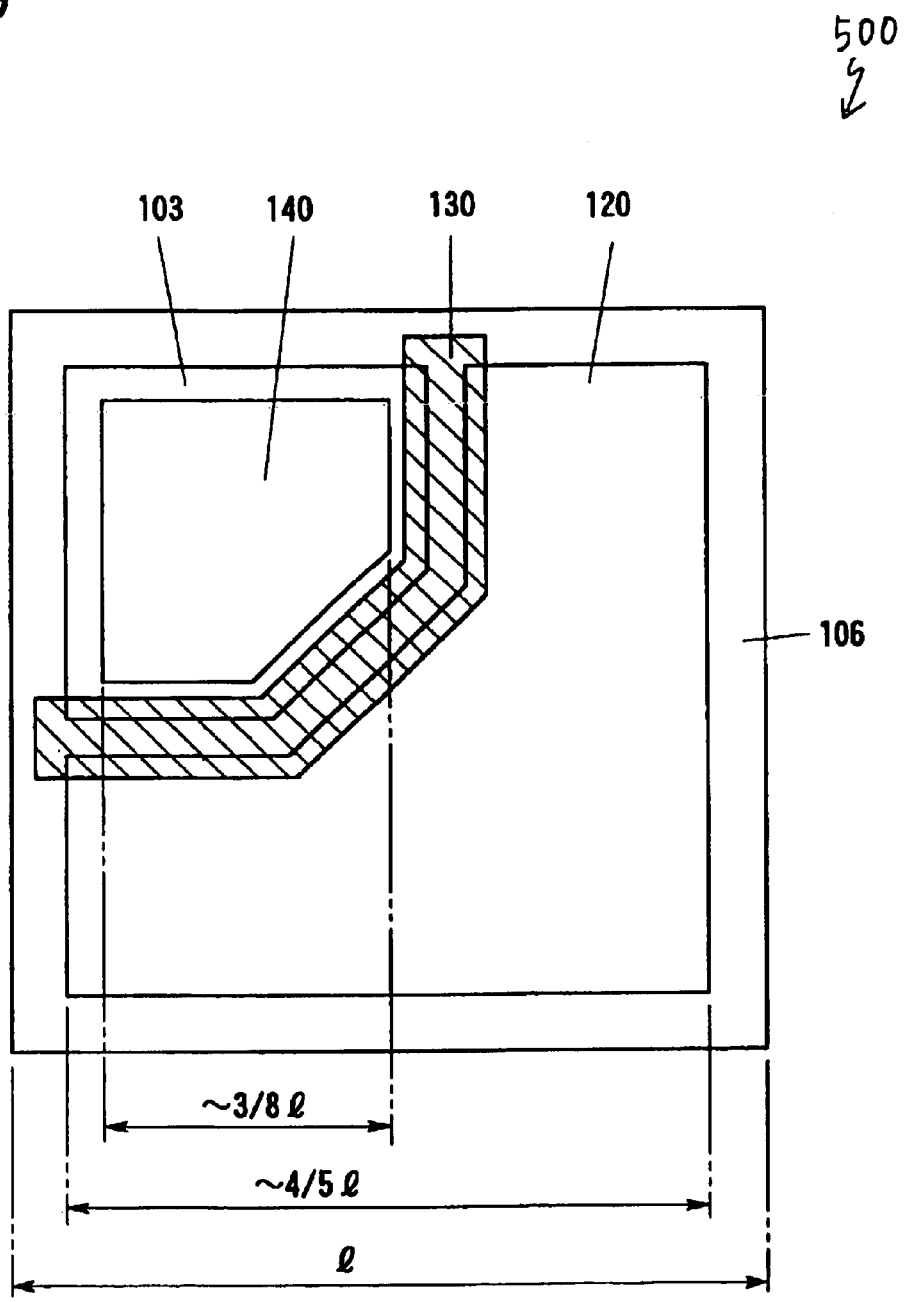
FIG. 9 is a plan view of a light-emitting semiconductor device 500 in accordance with an embodiment of the light-emitting semiconductor device 300 shown in FIG. 4.

FIG. 9 shows a plan view of a light-emitting semiconductor device 500, an embodiment of the light-emitting semiconductor device 300 shown in FIG. 4 of the present invention. Because the light-emitting semiconductor 500 has the almost same structure as that of the light-emitting device 300, each layers has the same number and uses the same metal as that of each layers in FIG. 4.

Then an aging variation for a luminous intensity of the light-emitting semiconductor device 500 has been measured. FIG. 5B shows a table comparing aging variations for luminous intensities of the light-emitting semiconductor device 500 and the light-emitting semiconductor device 400 of prior art. As shown in FIG. 5B, with respect to the luminous intensity, the present invention can hold 95% of the initial value after 100 hours and 90% after 1000 hours, while the light-emitting semiconductor device 400 can only hold 90% of the initial value after 100 hours and 85% after 1000 hours. Accordingly, the present invention can improve a durability compared with the light-emitting semiconductor device 400 of prior art.

Because the structure of the flip chip type of light-emitting semiconductor device 500 allows itself to have a high luminous intensity and durability, the protection layer 130 can be omitted in considerable area and both the positive and the negative electrodes can use wider area to connect to an external electrode. As shown FIG. 9, the negative electrode and the positive electrode can occupy over 10% and over 40% of the upper area of the light-emitting semiconductor device 500, respectively. As a result, a connection with an external electrode cannot be restricted to a wire bonding. Alternatively, the electrodes can be connected to an external electrode by forming a bump by solder or a gold ball directly on the positive and the negative electrodes, or the light-emitting semiconductor device 500 is inverted and can be directly connected with a circuit board.

In the fourth embodiment, the multiple positive electrode 120 has a thickness about 1.5 μm. Alternatively, the thickness of the multiple positive electrode 120 can be in the range of 0.11 μm to 10 μm. When the thickness of the multiple positive electrode 120 is less than 0.11 μm, a light reflectivity becomes insufficient, and a firm adhesion to connecting materials such as bump, a gold ball, etc. cannot be obtained. And when the thickness of the multiple positive electrode 120 is more than 10 μm, too much time and materials for deposit are required, which means that the thickness is of no use concerning a production cost performance.

In the fourth embodiment, the first positive electrode layer 121 has a thickness about 0.3 μm. Alternatively, the thickness of the first positive electrode layer 121 can be in the range of 0.01 μm to 5 μm. The thickness of the first positive electrode layer 121 should be more preferably in the range of 0.05 μm to 1 μm. When the thickness of the first positive electrode layer 121 is too small, a light reflectivity becomes insufficient, and when too large, too much time and materials for deposit are required, which means that the thickness is of no use concerning a production cost performance.

In the fourth embodiment, the second positive electrode layer 122 has a thickness about 1.2 μm. Alternatively, the thickness of the second positive electrode layer 122 can be in the range of 0.03 μm to 5 μm. The thickness of the second positive electrode layer 122 should be preferably in the range of 0.05 μm to 3 μm, 0.1 μm to 5 μm, and more preferably, 0.2 μm to 3 μm, and further more preferably, 0.5 μm to 2 μm. When the thickness of the second positive electrode layer 122 is too small, a firm adhesion to connecting materials such as a bump, a gold ball, etc. cannot be obtained. And when too large, too much time and materials for deposit are required, which means that the thickness is not preferable for both the second positive electrode layer 122 and the negative electrode 140, concerning a production cost performance.

In the fourth embodiment, the third positive electrode layer 123 has a thickness about 20 Å. Alternatively, the thickness of the third metal layer 112 can be in the range of 3 Å to 1000 Å. The thickness of the third positive electrode layer 123 should be preferably in the range of 5 Å to 1000 Å, more preferably, 10 Å to 500 Å, and further more preferably, 15 Å to 100 Å. When the thickness of the third positive electrode layer 123 is too small, an adhesion to the protection layer 130 is weakened, and when too large, a resistivity becomes too large.

In the fourth embodiment, the third positive electrode layer 123 is made of titanium (Ti). Alternatively, the third positive electrode layer 123 can be made of chromium (Cr).

(Fifth Embodiment)

Figure 10:
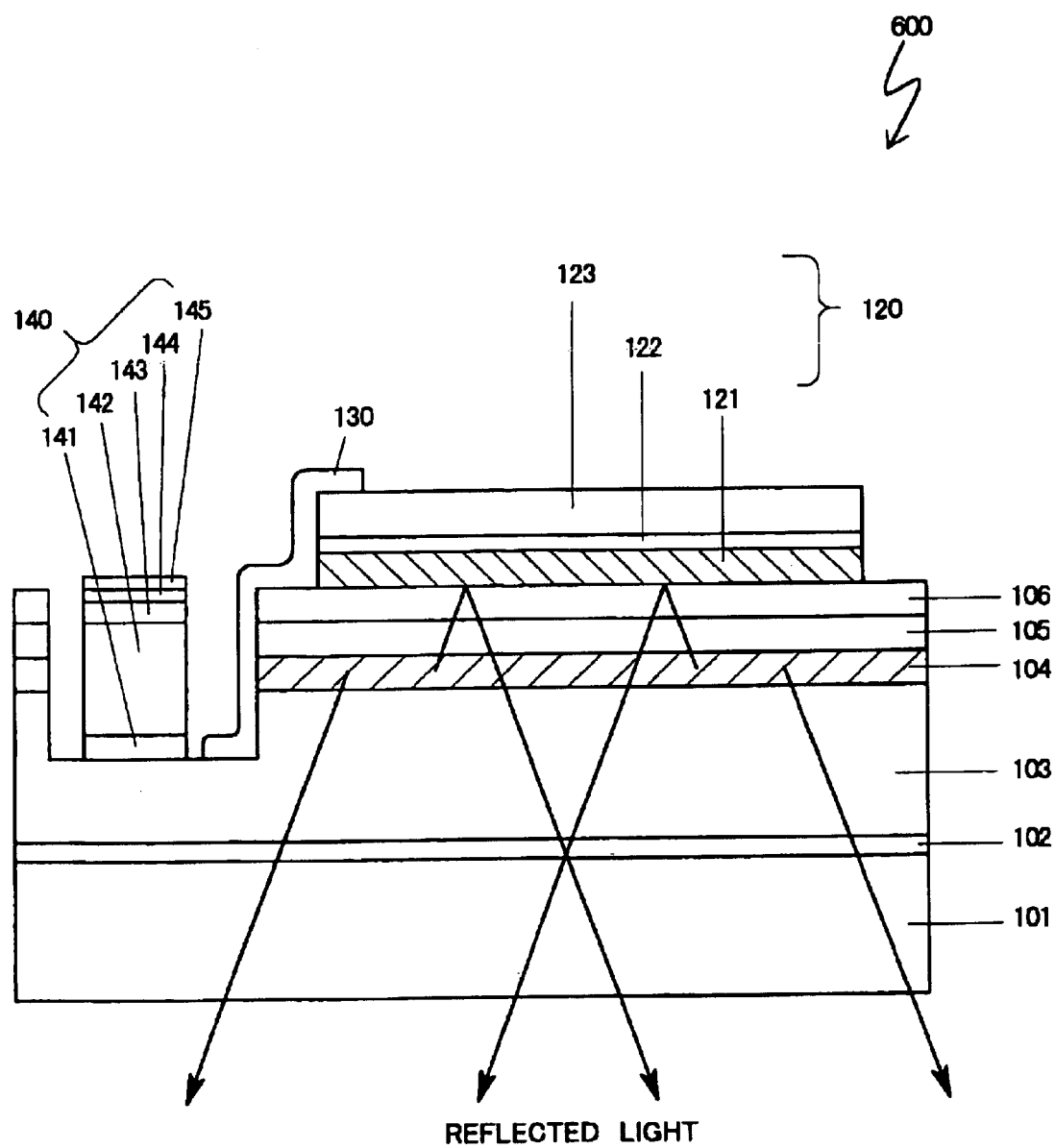
FIG. 10 is a a sectional view of a flip tip type of light-emitting semiconductor device 600 in accordance with the fifth embodiment of the present invention.

FIG. 10 illustrates a sectional view of a flip chip type of light-emitting semiconductor device 600. The semiconductor device 600 has a sapphire substrate 101 which has a buffer layer 102 made of nitride aluminum (AlN) having a thickness of 200 Å and an n$^+$-layer 103 having a thickness of 4.0 μm and a high carrier concentration successively thereon.

And an emission layer 104 having a multi quantum-well (MQW) structure made of GaN and $Ga_{0.8}In_{0.2}N$ is formed on the n$^+$-layer 103. A Mg-doped p-layer 105 made of $Al_{0.15}Ga_{0.85}N$ having a thickness of 600 Å is formed on the emission layer 104. Further, a Mg-doped p-layer 106 made of GaN having a thickness of 1500 Å is formed on the p-layer 105.

A positive electrode 120, which may be also referred to as a multiple positive electrode 120 hereinafter, is formed by a metal deposit on the p-layer 106 and a negative electrode 140 is formed on the n$^+$-layer 103. The multiple positive electrode 120 is made of a three-layer structure, having a first positive electrode layer 121 which is adjacent to the p-layer 106, a second positive electrode layer 122 formed on the first positive electrode layer 121, and a third positive electrode layer 123 formed on the second positive electrode layer 122.

The first positive electrode layer 121 is a metal layer adjacent to the p-layer 106, which is made of rhodium (Rh) and has a thickness about 3000 Å. The second positive electrode layer 122 is a metal layer made of titanium (Ti), having a thickness about 100 Å. The third positive electrode layer 123 is a metal layer made of gold (Au), having a thickness about 500 Å.

A negative electrode 140 having a multi-layer structure is formed on an exposed portion of the n$^+$-layer 103 of high carrier concentration. The multi-layer structure is comprising following five layers: about 175 Å in thickness of vanadium (V) layer 141; about 1000 Å in thickness of aluminum (Al) layer 142; about 500 Å in thickness of vanadium (V) 143; about 5000 Å in thickness of nickel (Ni) layer 144; and about 8000 Å in thickness of gold (Au) layer 145.

A protection layer 130 made of SiO2 film is formed between the multiple positive electrode 120 and the negative electrode 140. The protection layer 130 covers a portion of the n$^+$-layer 103 exposed to form the negative electrode 140, sides of the emission layer 104, the p-layer 105, and the p-layer 106 exposed by etching, a portion of an upper surface of the p-layer 106, sides of the first positive electrode layer 121, the second positive electrode layer 122, and the third positive electrode layer 123, and a portion of an upper surface of the third positive electrode layer 123. A thickness of the protection layer 130 covering a portion of the upper surface of the third positive electrode layer 123 is 0.5 μm.

The present invention can improve the luminous efficiency by about 30 to 40% compared with the prior art.

Because the structure of the flip chip type of light-emitting semiconductor device 600 allows itself to have a high luminous intensity and durability, the protection layer 130 can be omitted in considerable area and both the positive and the negative electrodes can use wider area to connect to an external electrode. By forming a bump by solder or a gold ball directly on the positive and the negative electrodes, the light-emitting semiconductor device 600 is inverted and can be directly connected with a circuit board.

Further, the light-emitting semiconductor device 600 can also be connected with an external electrode by a wire bonding.

In the fifth embodiment, the multiple positive electrode 120 has a thickness about 0.36 μm. Alternatively, the thickness of the multiple positive electrode 120 can be in the range of 0.11 μm to 10 μm. When the thickness of the multiple positive electrode 120 is less than 0.11 μm, a light reflectivity becomes insufficient, and a firm adhesion to connecting materials such as a bump, a gold ball, etc. cannot be obtained. And when the thickness of the multiple positive electrode 120 is more than 10 μm, too much time and materials for deposit are required, which means that the thickness is of no use concerning a production cost performance.

In the fifth embodiment, the first positive electrode layer 121 has a thickness about 3000 Å. Alternatively, the thickness of the first positive electrode layer 121 can be in the range of 0.01 μm to 5 μm. The thickness of the first positive electrode layer 121 should be more preferably in the range of 0.05 μm to 1 μm. When the thickness of the first positive electrode layer 121 is too small, a light reflectivity becomes insufficient, and when too large, too much time and materials for deposit are required, which means that the thickness is of no use concerning a production cost performance.

In the fifth embodiment, the second positive electrode layer 122 has a thickness about 100 Å. Alternatively, the thickness of the second positive electrode layer 122 can be in the range of 3 Å to 1000 Å. The thickness of the second positive electrode layer 122 should be preferably in the range of 5 Å to 1000 Å, and more preferably, 5 Å to 500 Å, and further more preferably, 15 Å to 100 Å. When the thickness of the second positive electrode layer 122 is too small, a firm adhesion to connecting materials such as a bump, a gold ball, etc. cannot be obtained. And when too large, too much time and materials for deposit are required, which means that the thickness is not preferable for both the second positive electrode layer 122 and the negative electrode 140, concerning a production cost performance.

In the fifth embodiment, the third positive electrode layer 123 has a thickness about 500 Å. Alternatively, the thickness of the third positive electrode layer 123 can be in the range of 0.03 μm to 5 μm. The thickness of the third positive electrode layer 123 should be preferably in the range of 0.05 μm to 3 μm, 0.1 μm to 5 μm, more preferably, 0.2 μm to 3 μm, and further more preferably, 0.5 μm to 2 μm. When the thickness of the third positive electrode layer 123 is too small, an adhesion to the protection layer 130 is weakened, and when too large, a resistivity becomes too large.

In the fifth embodiment, the third positive electrode layer 123 is made of gold (Au). Alternatively, a fourth positive electrode 124 made of one of titanium (Ti), chromium (Cr), and an alloy including at least one of these metals can be formed on the third positive electrode layer 123 with the width of the third positive electrode layer of the third embodiment.

With respect to the structure of the layers of the electrodes in the first to fifth embodiments, physical and chemical composition of each layers in the light-emitting semiconductor device is shown at the instant time of deposition. It is needless to mention that solid solutions or chemical compounds are formed between each layers by physical or chemical treatments such as a heat treatment to obtain a firmer adhesion or to lower a contact resistivity.

In the first to fifth embodiments, the emission layer 104 has a MQW (multi-quantum well) structure. Alternatively, the emission layer 104 can have a SQW (single-quantum well) structure or a homozygous structure. Also, a III group nitride compound semiconductor layer (inclusive of a buffer layer) of the light-emitting semiconductor device in the present invention can be formed of one of a quaternary, ternary and binary layer compound $Al_xGa_yIn_{1-x-y}N$ ($0 \leq x \leq 1$, $0 \leq y \leq 1$, $0 \leq x+y \leq 1$).

Alternatively, metal nitrides such as titanium nitride (TiN), hahnium nitride (HfN) or metal oxide such as zinc oxide (ZnO), magnesium oxide (MgO), manganese oxide (MnO) can be used to form the buffer layer.

In the embodiments, magnesium (Mg) is used as a p-type impurity. Alternatively, group II elements such as beryllium (Be) or zinc (Zn) can be used. Further, to lower a resistivity of the p-type semiconductor layer doped with a p-type impurity described above, activates treatments such as radiation of electron rays or annealing can be executed.

In the embodiments, the $n^+$-layer 103 of high carrier intensity is made of silicon (Si) doped gallium nitride (GaN). Alternatively, these n-type semiconductor layers can be formed by doping the group III nitride compound semiconductor described above with group IV elements such as silicon (Si) or germanium (Ge), or group VI elements.

In the embodiments, sapphire is used for the substrate. Alternatively, silicon carbide (SiC), zinc oxide (ZnO), magnesium oxide (MgO), or manganese oxide (MnO) can be used to form the substrate.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A flip chip type of light-emitting semiconductor device comprising:

a substrate;

group III nitride compound semiconductor layers formed on said substrate, said layers comprising a p-type semiconductor layer;

a positive electrode including at least one layer of a first positive electrode layer which is formed on or above said p-type semiconductor layer and reflects light toward said substrate, said first positive electrode layer comprising at least one of rhodium (Rh), ruthenium (Ru), and an alloy including at least one of these metals; and a first thin-film metal layer, comprising at least one of cobalt (Co), nickel (Ni), and an alloy including at least one of these metals, formed between said p-type semiconductor layer and said first positive electrode layer, wherein said substrate transmits said light reflected from said positive electrode, and light is emitted from a substrate side of said light-emitting device.

2. A flip chip type of light-emitting semiconductor device using group III nitride compound according to claim 1, wherein a thickness of said first thin-film metal layer is in the range of 2 Å to 200 Å.

3. A flip chip type of light-emitting semiconductor device using group III nitride compound according to claim 1, further comprising:
   a second thin-film metal layer, comprising at least one of gold (Au) and an alloy including gold (Au), formed between said first thin-film metal layer and said first positive electrode layer.

4. A flip chip type of light-emitting semiconductor device using group III nitride compound according to claim 3, wherein a thickness of said second thin-film metal layer is in the range of 10 Å to 500 Å.

5. A flip chip type of light-emitting semiconductor device comprising:
   a substrate;
   group III nitride compound semiconductor layers formed on said substrate, said layers comprising a p-type semiconductor layer;
   a positive electrode including at least one layer of a first positive electrode layer which is formed on or above said p-type semiconductor layer and reflects light toward said substrate, said first positive electrode layer comprising at least one of rhodium (Rh), ruthenium (Ru), and an alloy including at least one of these metals; and
   a first thin-film metal layer, comprising at least one of cobalt (Co), nickel (Ni), and an alloy including at least one of these metals, formed between said p-type semiconductor layer and said first positive electrode layer,
   wherein said substrate transmits said light reflected from said positive electrode, and light is emitted from a substrate side of said light-emitting device, and
   wherein said positive electrode has a multi-layer structure comprising a plurality of metals.

6. A flip chip type of light-emitting semiconductor device using group III nitride compound according to claim 5, wherein a thickness of said first thin-film metal layer is in the range of 2 Å to 200 Å.

7. A flip chip type of light-emitting semiconductor device using group III nitride compound according to claim 5, further comprising:
   a second thin-film metal layer, comprising at least one of gold (Au) and an alloy including gold (Au), formed between said first thin-film metal layer and said first positive electrode layer.

8. A flip chip type of light-emitting semiconductor device using group III nitride compound according to claim 7, wherein a thickness of said second thin-film metal layer is in the range of 10 Å to 500 Å.

9. A flip chip type of light-emitting semiconductor device comprising:
   a substrate;
   a plurality of group III nitride compound semiconductor layers comprising a p-type semiconductor layer, formed on said substrate;
   a positive electrode comprising at least one layer, said at least one layer comprising a first positive electrode layer which is formed above said p-type semiconductor layer, reflects light toward said substrate, and comprises at least one of silver (Ag), platinum (Pt), palladium (Pd) and an alloy including at least one of these metals; and
   a first thin-film metal layer comprising at least one of cobalt (Co), nickel (Ni) and an alloy including at least one of these metals, formed between said p-type semiconductor layer and said first positive electrode layer.

10. A flip chip type of light-emitting semiconductor device using group III nitride compounds according to claim 9, wherein a thickness of said first thin-film metal layer is in the range of 2 Å to 200 Å.

11. A flip chip type of light-emitting semiconductor device using group III nitride compounds according to claim 9, further comprising:
   a second thin-film metal layer comprising at least one of gold (Au) and an alloy including gold (Au), formed between said first thin-film metal layer and said fist positive electrode layer.

12. A flip chip type of light-emitting semiconductor device using group III nitride compounds according to claim 11, wherein a thickness of said second thin-film metal layer is in the range of 10 Å to 500 Å.

13. A flip chip type of light-emitting semiconductor device using group III nitride compounds according to claim 9, wherein a thickness of the first positive electrode layer is in the range of 0.01 μm to 500 μm.

14. A flip chip type of light-emitting semiconductor device comprising:
   a substrate;
   a plurality of group III nitride compound semiconductor layers formed on said substrate;
   a first positive electrode layer which is formed above a p-type semiconductor layer, reflects light toward said substrate, and comprises at least one of silver (Ag), platinum (Pt), palladium (Pd) and an alloy including at least one of these metals; and
   a second positive electrode layer comprising at least one of gold (Au) and an alloy including gold (Au), formed on said first positive electrode layer,
   wherein a thickness of the first positive electrode layer is in the range of 0.01 μm to 5 μm.

15. A flip chip type of light-emitting semiconductor device comprising:
   a substrate;
   a plurality of group III nitride compound semiconductor layers formed on said substrate;
   a first positive electrode layer which is formed above a p-type semiconductor layer, reflects light toward said substrate, and comprises at least one of silver (Ag), platinum (Pt), palladium (Pd) and an alloy including at least one of these metals; and
   a second positive electrode layer comprising at least one of gold (Au) and an alloy including gold (Au), formed on said first positive electrode layer,
   wherein a thickness of said second positive electrode layer is in the range of 0.03 μm to 5 μm.

16. A flip chip type of light-emitting semiconductor device comprising:
   a substrate;
   a plurality of group III nitride compound semiconductor layer formed on said substrate;
   a first positive electrode layer which is formed above a p-type semiconductor layer, reflects light toward said substrate, and comprises at least one of silver (Ag), platinum (Pt), palladium (Pd) and an alloy including at least one of these metals;

a second positive electrode layer comprising at least one of gold (Au) and an alloy including gold (Au), formed on said first positive electrode layer; and a third positive electrode layer comprising at least one of titanium (Ti), chromium (Cr) and an alloy including at least one of these metals, formed on said second positive electrode layer.

17. A flip chip type of light-emitting semiconductor device using group III nitride compounds according to claim 16, wherein a thickness of said third positive electrode layer in the range of 3 Å to 1000 Å.

* * * * *

UNITED STATES PATENT AND TRADEMARK OFFICE
CERTIFICATE OF CORRECTION

PATENT NO. : 6,936,859 B1 Page 1 of 1
DATED : August 30, 2005
INVENTOR(S) : Uemura et al.

It is certified that error appears in the above-identified patent and that said Letters Patent is hereby corrected as shown below:

Column 16,
Line 26, replace "500$\mu$m" with -- 5$\mu$m --.

Signed and Sealed this

Eighth Day of November, 2005

JON W. DUDAS
*Director of the United States Patent and Trademark Office*